(12) United States Patent
Wunderer et al.

(10) Patent No.: US 10,418,785 B2
(45) Date of Patent: Sep. 17, 2019

(54) ELECTRON BEAM PUMPED NON-C-PLANE UV EMITTERS

(71) Applicant: Palo Alto Research Center Incorporated, Palo Alto, CA (US)

(72) Inventors: Thomas Wunderer, Palo Alto, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/194,914

(22) Filed: Nov. 19, 2018

(65) Prior Publication Data

US 2019/0103729 A1    Apr. 4, 2019

Related U.S. Application Data

(62) Division of application No. 15/600,569, filed on May 19, 2017, now Pat. No. 10,135,227.

(51) Int. Cl.
| | |
|---|---|
| *H01S 5/00* | (2006.01) |
| *H01S 5/32* | (2006.01) |
| *H01S 5/343* | (2006.01) |
| *H01S 5/04* | (2006.01) |
| *H01S 5/125* | (2006.01) |
| *H01S 5/30* | (2006.01) |
| *H01L 33/16* | (2010.01) |
| *H01L 33/32* | (2010.01) |

(Continued)

(52) U.S. Cl.
CPC ............ *H01S 5/3202* (2013.01); *H01L 33/10* (2013.01); *H01L 33/16* (2013.01); *H01L 33/32* (2013.01); *H01S 5/0205* (2013.01); *H01S 5/04* (2013.01); *H01S 5/125* (2013.01); *H01S 5/305* (2013.01); *H01S 5/32341* (2013.01); *H01S 5/34333* (2013.01); *H01S 5/3013* (2013.01); *H01S 5/343* (2013.01); *H01S 2304/04* (2013.01)

(58) Field of Classification Search
CPC ........ H01S 5/34333; H01S 5/04; H01S 5/125; H01S 5/3202; H01S 5/305; H01S 5/3013; H01S 5/343; H01S 2304/04
See application file for complete search history.

(56) References Cited

U.S. PATENT DOCUMENTS

| | | | |
|---|---|---|---|
| 7,498,182 B1 * | 3/2009 | Sampath | B82Y 20/00 438/21 |
| 7,590,161 B1 | 9/2009 | Hug et al. | |

(Continued)

OTHER PUBLICATIONS

Balakrishnan et al., "MOCVD growth of semipolar AlxGA1-xN on m-plane sapphire for applications in deep-ultraviolet light emitters", vol. 208, Issue 12, Dec. 2011, pp. 2724-2729.
Banal et al., "Deep-ultraviolet light emission properties of nonpolar M-plane AlGaN quantum wells", Applied Physics Letters, 105, 2014, 4 pages.

(Continued)

*Primary Examiner* — Kinam Park
(74) *Attorney, Agent, or Firm* — Hollingsworth Davis, LLC

(57) ABSTRACT

An ultraviolet (UV) radiation emitting device includes an epitaxial heterostructure comprising an AlGaInN active region. The AlGaInN active region includes one or more quantum well structures with Al content greater than about 50% and having a non-c-plane crystallographic growth orientation. The AlGaInN active region is configured to generate UV radiation in response to excitation by an electron beam generated by an electron beam pump source.

20 Claims, 23 Drawing Sheets

(51) Int. Cl.
*H01S 5/323* (2006.01)
*H01S 5/02* (2006.01)
*H01L 33/10* (2010.01)

(56) References Cited

U.S. PATENT DOCUMENTS

| | | |
|---|---|---|
| 8,203,159 B2 | 6/2012 | Zhong et al. |
| 8,653,503 B2 * | 2/2014 | Chung ................. B82Y 20/00 |
| | | 257/103 |
| 8,964,796 B2 | 2/2015 | Wunderer et al. |
| 10,056,735 B1 * | 8/2018 | Schubert ............ H01S 5/34333 |
| 2007/0093073 A1 | 4/2007 | Farrel, Jr. et al. |
| 2014/0133506 A1 * | 5/2014 | Wunderer ............... H01S 5/041 |
| | | 372/45.01 |
| 2014/0369367 A1 * | 12/2014 | Wunderer ............ H01S 5/3401 |
| | | 372/5 |

OTHER PUBLICATIONS

Chandasekaran et al., "Ultraviolet light emitting diodes using non-polar A-plane AlGaN multiple quantum wells", Mater. Res. Soc. Symp. Proc., vol. 955, 2007, 3 pages.
Kneissl et al., "Ultraviolet semiconductor laser diodes on bulk AlN", Journal of Applied Physics, vol. 101, 2007, 5 pages.
Mauder, "Physics, MOVPE growth, and investigate of m-plane GaN films and InGaN/GaN quantum wells on y-LiAlO2 Substrates", Dec. 20, 2011, 133 pages.
Tabataba-Vakiliet al., "Dominance of radiative recombination from electron-beam-pumped deep-UV AlGaN multi-quantum-well heterostructures", Applied Physics Letters 109, 2016, 4 pages.
Taniyasu et al., "Improved Emission Efficiency of 210-nm Deep-ultraviolet Aluminum Nitride Light-emitting Diode", NTT Technical Review, vol. 8, No. 8, Aug. 2010, 5 pages.

* cited by examiner

ELECTRON BEAM PUMPED NON-C-PLANE UV EMITTERS

RELATED APPLICATIONS

This application is a continuation of U.S. Ser. No. 15/600,569, filed May 19, 2017, which is incorporated herein by reference in its entirety.

STATEMENT REGARDING FEDERALLY SPONSORED RESEARCH AND DEVELOPMENT

This invention was made with Government support under Contract No. HR0011-15-C-0025 DARPA-LUSTER Program awarded by DARPA. The Government has certain rights in this invention.

TECHNICAL FIELD

This application relates generally to devices that emit ultraviolet radiation and to systems and methods pertaining to such devices.

BACKGROUND

Ultraviolet (UV) emitting devices are of considerable interest for applications that include water purification, analytical devices for medical and biotechnology fields, UV curing, and currency screening, among other applications. Light emitting devices that emit in spectral ranges suitable for these and other applications can be fabricated based on a variety of material systems, including group III-V and II-VI binary, ternary, and quaternary compounds and alloys and various combinations thereof.

SUMMARY

Some embodiments are directed to a device that emits ultraviolet (UV) radiation through spontaneous emission. The UV radiation emitting device includes an epitaxial heterostructure comprising an AlGaInN active region. The active region includes one or more quantum well structures with Al content greater than about 50% having a non-c-plane crystallographic growth orientation, The AlGaInN active region is configured to generate UV radiation in response to excitation by an electron beam from an electron beam pump source.

Some embodiments are directed to a device that emits ultraviolet (UV) radiation through stimulated emission. The UV radiation emitting device includes an epitaxial heterostructure comprising an AlGaInN active region. The active region includes one or more quantum well structures with Al content greater than about 50% and having a non-c-plane crystallographic growth orientation. The AlGaInN active region is configured to generate UV radiation in response to pumping by an electron beam. The device includes a first reflector and a second reflector, wherein the active region is disposed between the first reflector and the second reflector.

Some embodiments are directed to a method of operating a UV radiation emitting device. The method includes electron beam pumping an active region of an epitaxial III-N heterostructure having a non-c-plane crystallographic orientation. UV radiation is generated in the active region in response to pumping by the electron beam. The UV radiation has a wavelength less than about 250 nm.

Some embodiments are directed to a method of making an UV radiation emitting device. A bulk AlN boule is sliced to provide a substrate having growth surface with a non c-plane crystallographic orientation. A heterostructure is epitaxially grown on the AlN substrate. The heterostructure comprises a UV emitting active region and has the non-c-plane crystallographic orientation of the growth surface. In some embodiments, an epitaxial AlN layer may be epitaxially grown on the grown surface of the bulk AlN boule before the heterostructure comprising the UV emitting region is formed.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION

The efficiency of UV emitting devices that are grown on c-plane substrates or templates drops by several orders of magnitude as the emission wavelength becomes shorter than about 250 nm. The drop in efficiency occurs because the radiation is mainly transverse-magnetic (TM) polarized at the shorter wavelengths and cannot be easily extracted out of the wafer plane. Embodiments described herein involve structures in which the crystal orientations of the substrate, and thus the orientation of the light emitting layers, e.g., quantum wells (QWs) grown on the substrate, are rotated to a non-c-plane orientation. Rotating the crystal orientation of the substrate and QWs can enhance extraction of UV radiation, particularly for UVC radiation between 200 nm and 290 nm.

Some embodiments discussed herein involve approaches that enhance the efficiency of light extraction from vertically emitting or edge emitting UV sources based on the AlGaN material system. The approaches discussed below involve the use of non-c-plane oriented AlGaN quantum wells that may be epitaxially grown on a non-c-plane oriented surface of an AlN substrate.

Another major challenge for UV wavelength emitters is the p-type conductivity of these high band gap materials needed for UV radiation. Today's device efficiencies suffer from either high light absorption losses when p-GaN is used as hole injection layer or high voltages and reduced carrier injection when p-AlGaN materials are implemented to gain at least partially UV transparency. Some embodiments discussed herein use electron beam (e-beam) excitation for the creation of electron-hole pairs and decreased light absorption losses.

Figure 1A:
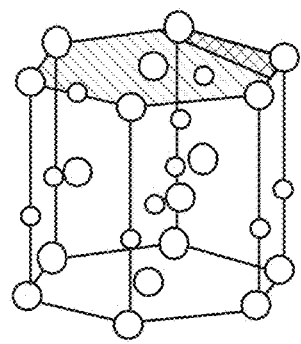
FIGS. 1A through 1F show crystallographic planes of hexagonal materials.
Figure 1B:
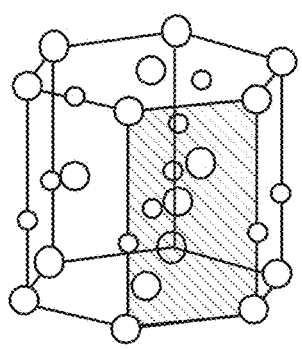
Figure 1C:
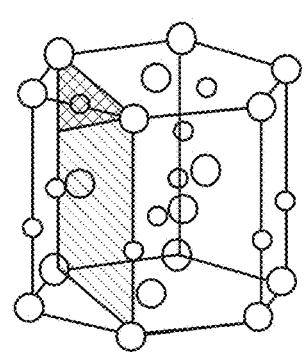
Figure 1D:
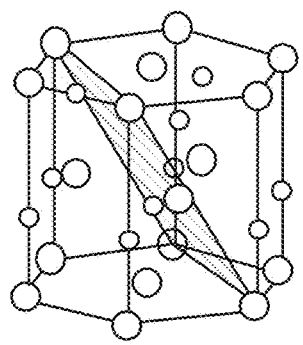
Figure 1E:
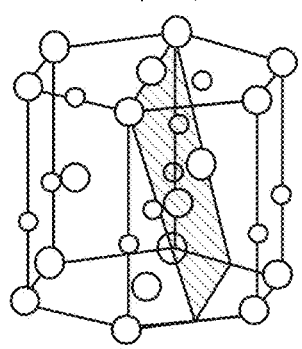
Figure 1F:
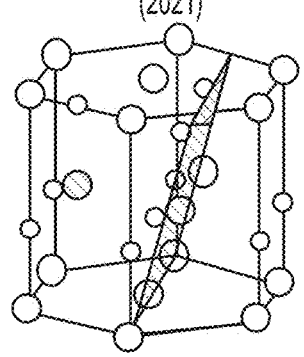

FIGS. 1A through 1F show crystallographic planes of hexagonal materials such as GaN and AlN. FIG. 1A illustrates the polar plane (0001), referred to as the c-plane; FIG. 1B illustrates the non-polar ($1\bar{1}00$) or (1-100) plane, referred to as the m-plane; and FIG. 1C illustrates the non-polar ($\bar{1}20$) or (-1-120) plane, referred to as the a-plane. FIGS. 1D through 1F show semi-polar planes ($11\bar{2}2$) or (11-22), ($20\bar{2}1$) or (20-21), and ($20\bar{2}\bar{1}$) or (20-2-1). Other common semi-polar crystal planes that could be used for embodiments disclosed herein include (10-11), (10-1-1), (11-2-2), (10-13), (10-1-3), (30-31), and (30-3-1), and others. High quality c-plane AlGaN structures can be grown on c-plane substrate surfaces, but the UV emission is only TE polarized for longer emission wavelength and the device is plagued by extraction issues discussed above. AlGaN structures can be grown on non-polar m- and a-plane substrate surfaces. However, epitaxial growth conditions are more demanding for producing materials with featureless surfaces that are free of structural defects. Some embodiments described herein are directed to devices with AlGaN or AlGaInN QWs grown on surfaces with semi-polar orientations. As discussed below, growth on semi-polar orientations, such as (20-21) and (20-2-1) planes, were shown to produce smooth surfaces and sharp heterostructure interfaces needed for high quality UV emitters.

Figure 2:
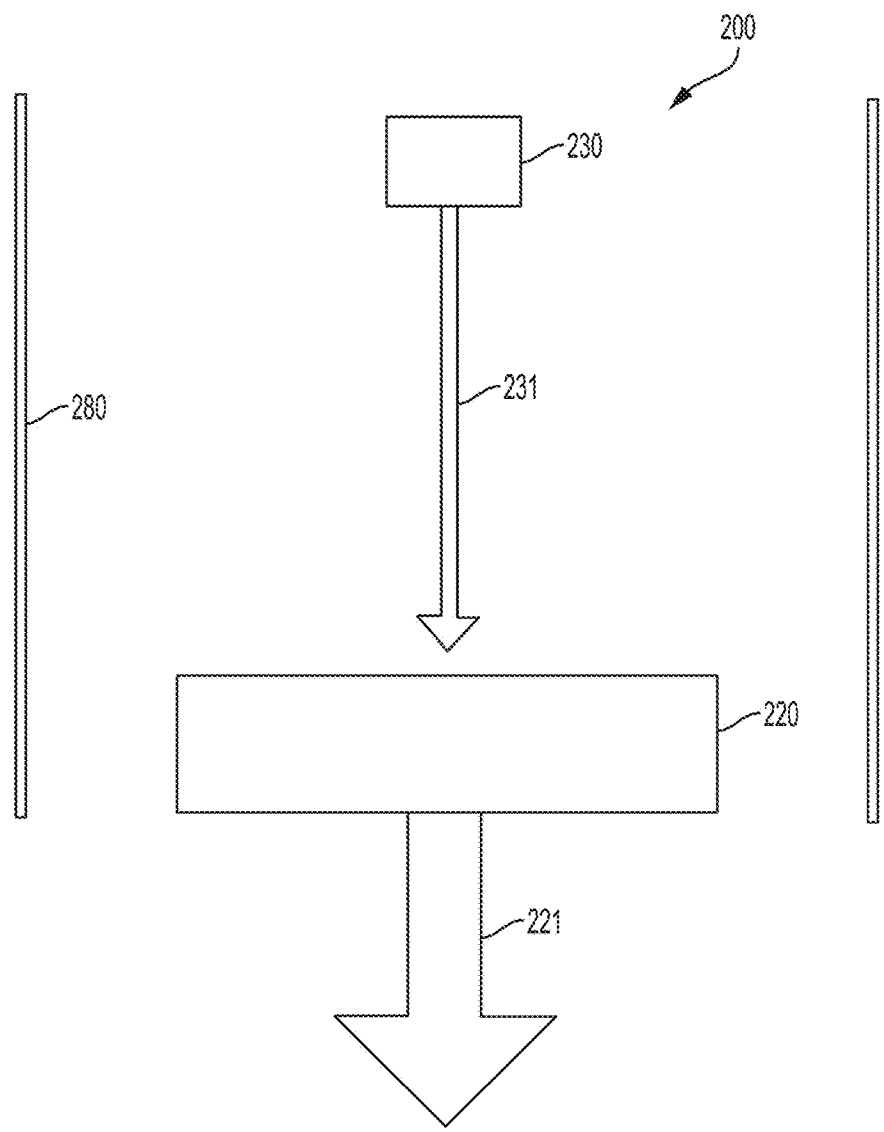
FIG. 2 shows a cross sectional diagram of a UV emitting device that can produce spontaneous UV emission in accordance with some embodiments.

FIG. 2 shows a cross sectional diagram of a UV emitting device 200 that can be used to produce spontaneous UV emission 221 in accordance with some embodiments. The device includes an epitaxial heterostructure 220 comprising a UV emitting active region. For example, the UV emitting active region may comprise one or more quantum well (QW) structures that are grown to have a non-c-plane crystallographic orientation. The active region is configured to emit radiation in response to pumping by an electron beam 231 produced by an electron beam source 230. In some embodiments, the UV active region includes AlGaN or AlGaInN with Al content greater than 50% such that the UV radiation emitted by the active region is less than about 250 nm. Portions of the device 200 may be disposed within a vacuum chamber 280 in some embodiments.

In some embodiments, the active region may comprise several quantum wells, e.g., 1 to 50 quantum wells, having Al composition of about 70%. The thickness of the quantum wells can be in a range of about 0.5 nm to about 5 nm, or in a range of about 1 nm to about 3 nm, for example. Each quantum well is disposed between barrier layers. In some embodiments, the Al composition of the barrier layers is in a range of about 80% to about 99%. The active region including the quantum wells and barrier layers may have a thickness of between about 200 nm to about 1000 nm or between about 400 nm to about 800 nm in some embodiments.

To further facilitate current flow through the heterostructure 220, one or more heterostructure layers may be doped with n-type dopants, increasing the electrical conductivity of the layers. The heterostructure layers may be doped n-type by incorporating impurities such as Si, Ge, and Sn. For example, one or more quantum wells and/or barrier layers may be doped with an n-type dopant at a level of about $10^{17}$ to $10^{20}/cm^3$ to achieve a conductivity in the doped layers between about 0.01 $(\Omega cm)^{-1}$ and $10^4$ $(\Omega cm)^{-1}$. For example, at least a portion of the heterostructure layers may be n-doped with Si at a level greater than about $10^{17}/cm^3$. The impurity concentration is typically less than 3% of the total atomic concentration in the material.

In some embodiments, the heterostructure 220 may have a non-polar crystallographic orientation, e.g., m-plane or a-plane orientation. In some embodiments, the heterostructure may have a semi-polar crystallographic orientation. For example, suitable semi-polar orientations include the (10-11), (11-22), (20-21), (20-2-1), (10-11), (10-1-1), (11-2-2), (10-13), (10-1-3), (30-31), and (30-3-1), crystallographic orientations.

Figure 3A:
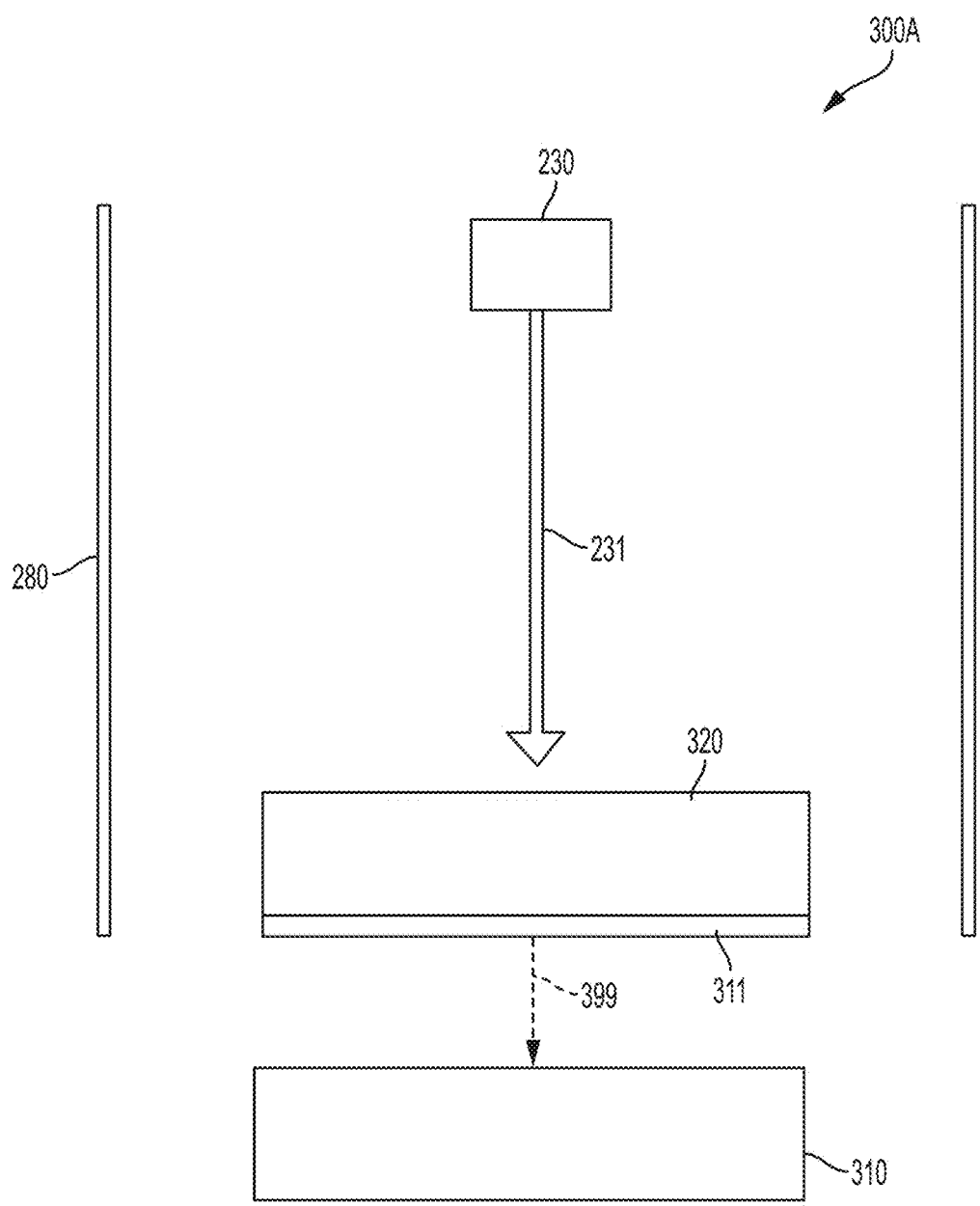
FIGS. 3A through 3C show cross sectional diagrams of UV emitting devices that can produce spontaneous UV emission in accordance with some embodiments.
Figure 3B:
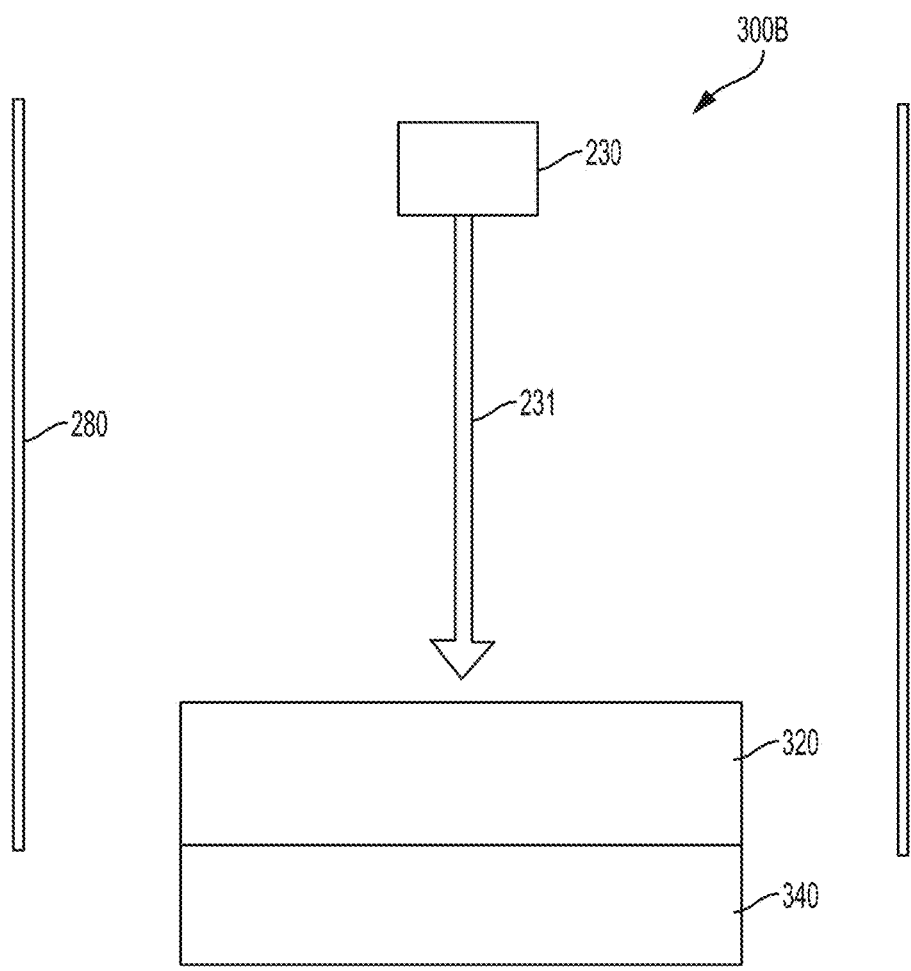
Figure 3C:
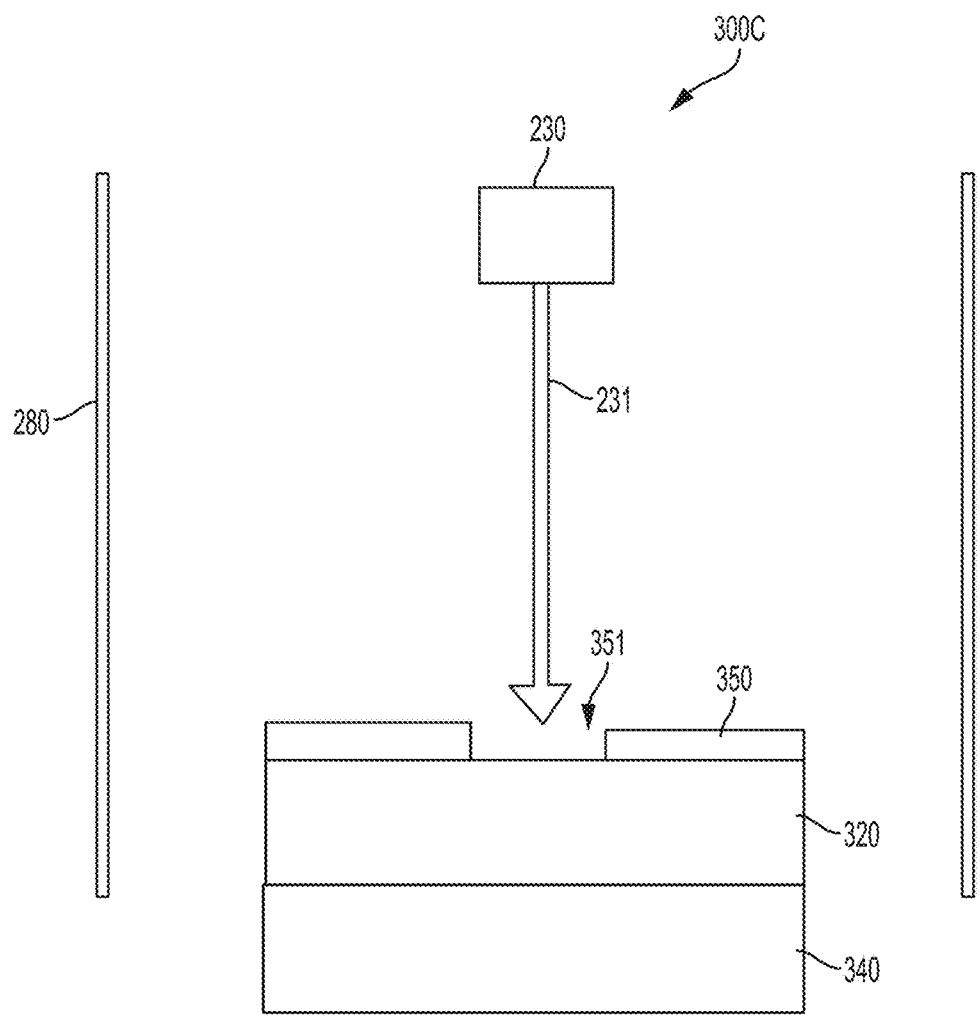

FIGS. 3A through 3C show cross sectional diagrams of UV emitting devices 300A, 300B, 300C that can be used to produce spontaneous UV emission in accordance with some embodiments. The epitaxial heterostructure 320 includes a non-c-plane oriented active region that is grown on and takes the orientation of a substrate 310 with the non-c-plane orientation. In some embodiments, the substrate 310 comprises a bulk AlN substrate that has been sliced from a bulk AlN boule or otherwise formed to provide a non-c-plane epitaxial growth surface. The substrate 310 may include an epitaxial AlN layer grown, e.g., by metal-organic vapor phase epitaxy (MOVPE) on the bulk AlN substrate. In some embodiments, the active region includes AlGaN with Al content greater than 50% such that the UV radiation emitted by the active region is less than about 250 nm. The surface roughness of the heterostructure 320 may be less than about 0.35 nm as measured by atomic force microscopy.

As illustrated by device 300A of FIG. 3A, the substrate 310 may be removed entirely, as indicated by arrow 399, or may be mechanically and/or chemically thinned to a substrate remnant 311 having a thickness less than about 100 μm or less than about 50 μm or even less than 20 μm, for example. After removal or thinning of the substrate, the backside of the heterostructure (or the remaining surface of the substrate remnant) may be roughened for enhanced light extraction.

Figure 4A:
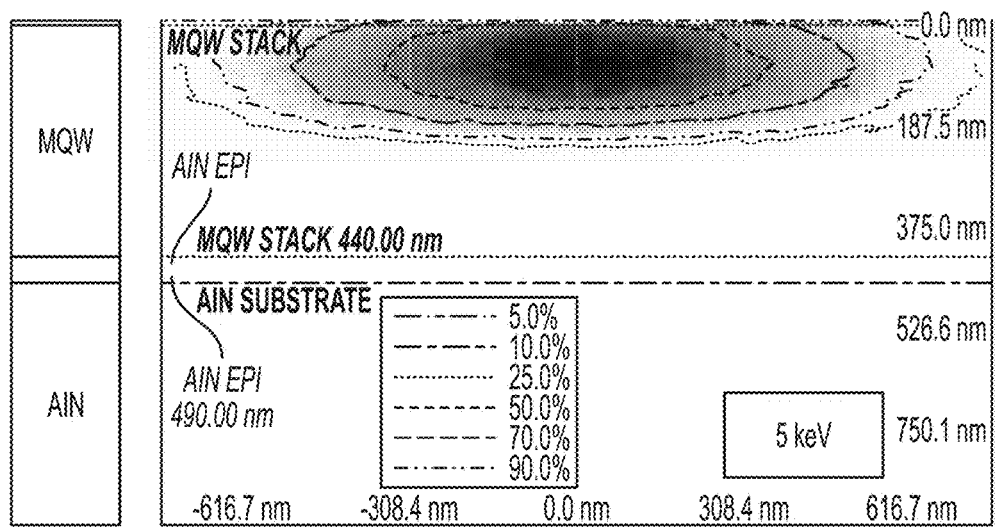
FIGS. 4A through 4C show the e-beam penetration into the heterostructure at e-beam energies of 5 keV, 10 keV, and 15 keV, respectively.
Figure 4B:
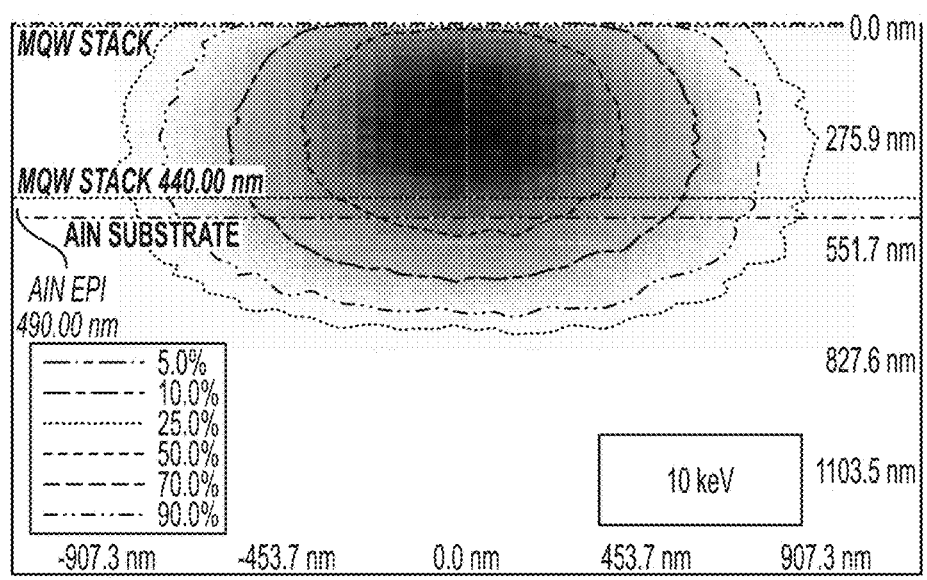
Figure 4C:
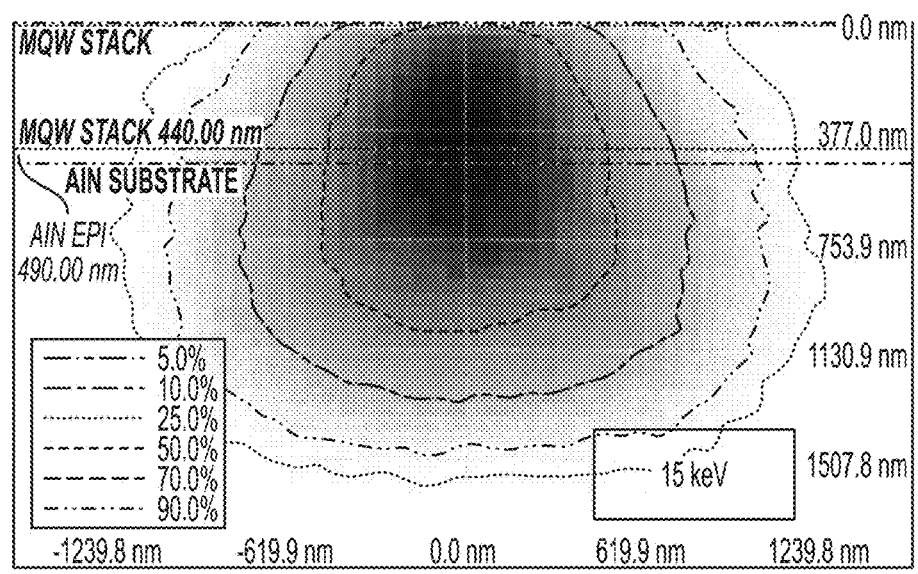
Figure 4D:
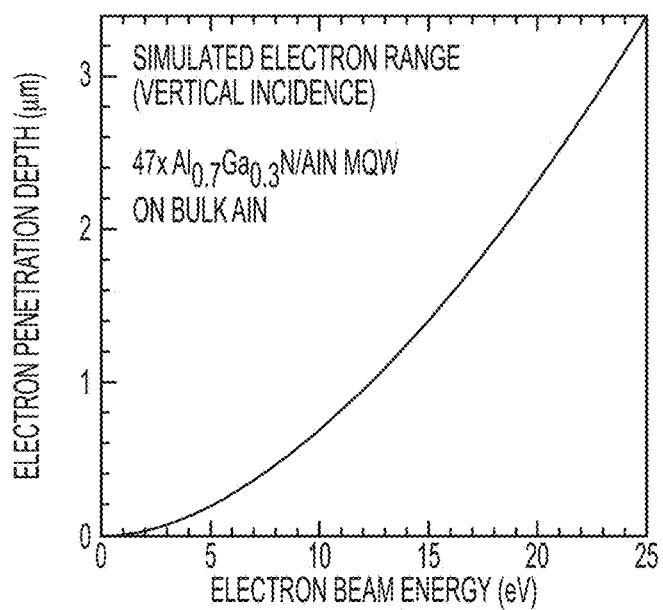
FIG. 4D is a graph of simulated electron penetration depth as a function of electron beam energy in eV for vertical incidence of the electron beam.

In some embodiments, the AlGaN QWs may have a thickness between 0.5 nm and 5 nm, or between 1 nm and 2 nm. Barrier layers that separate the QWs can have barrier thicknesses between 5 and 50 nm. The optimal active zone thickness depends on e-beam energy, for example between 5 to 30 keV. FIGS. 4A through 4C show the e-beam penetration into the heterostructure at e-beam energies of 5 keV, 10 keV, and 15 keV, respectively. FIG. 4D is a graph of simulated electron penetration depth in μm as a function of electron beam energy in eV for vertical incidence of the electron beam in a sample comprising 47 $Al_{0.7}Ga_{0.3}N/AlN$ QWs/barriers on bulk AN.

As shown in FIG. 3B, the UV emitting device 300B can include a heat sink 340 disposed on the heterostructure 320. Suitable heatsink materials include diamond, copper, copper-tungsten, aluminum, AlSiC, and/or other materials or material composites. In the case of non-transparent heat sink or heat spreader materials and bottom light emission a (beveled) hole should be included in the heat sink. If the semiconductor film is rather thin it needs to be mounted on a transparent heat spreader material first (e.g., diamond, sapphire, quartz, etc.)

As shown in FIG. 3C, the UV emitting device 300C may include one or more contacts 350 electrically coupled to the heterostructure 320 and configured to provide a current path that discharges electrons arising from the electron beam pumping of the heterostructure 320. In some embodiments, the contact 350 is a single contact 350 that can include an aperture 351 which exposes the heterostructure to the electron beam 231. In some embodiments, the UV emitting device can include multiple contacts coupled to the same electrical potential to discharge the electrons arising from the electron beam pumping of the heterostructure 320. In some embodiments the contact can be a continuous metal film that is thin enough to be penetrated by the e-beam and also acts as an optical reflector. For example, the contact 350 may comprise Al which shows a high reflectivity in the deep-UV.

Figure 5:
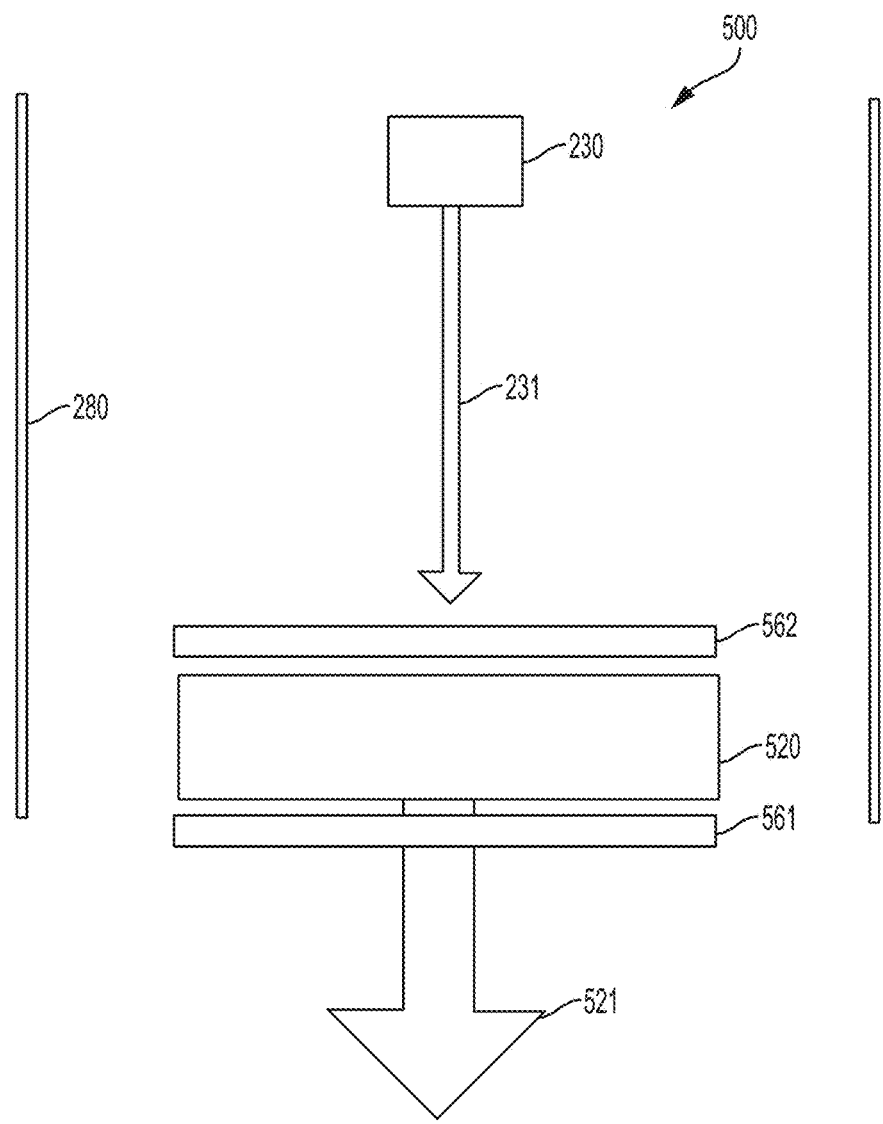
FIG. 5 shows a cross sectional diagram of a UV emitting laser device that can produce stimulated UV emission in accordance with some embodiments.

In some embodiments, a UV emitting device may be a vertically emitting laser device having a non-c-plane oriented active region which is configured for generation of UV stimulated emission. FIG. 5 shows a cross sectional diagram of a UV vertically emitting laser device 500 that can produce stimulated UV emission 521 in accordance with some embodiments. The device 500 includes an epitaxial heterostructure 520 comprising a UV emitting active region having a non-c-plane crystallographic orientation. The UV emitting active region may comprise one or more quantum well structures that are grown to have the non-c-plane crystallographic orientation. The heterostructure 520 is disposed between. The active region is disposed between first and second reflectors 561, 562 and is configured to emit laser radiation in response to pumping by an electron beam 231. In some embodiments, the UV active region includes AlGaN with Al content greater than 50% such that the UV radiation emitted by the active region is less than about 250 nm. Additional information regarding structures for electron beam pumped vertical cavity surface emitting lasers is described in commonly owned U.S. Pat. No. 9,112,332 which is incorporated herein by reference.

As previously discussed, the heterostructure 520 may have a non-polar crystallographic orientation, e.g., either an m-plane or an a-plane orientation. In some embodiments, the heterostructure 520 may have a semi-polar crystallographic orientation such as the (10-11), (11-22), (20-21), (20-2-1), or other crystallographic orientations.

Figure 6:
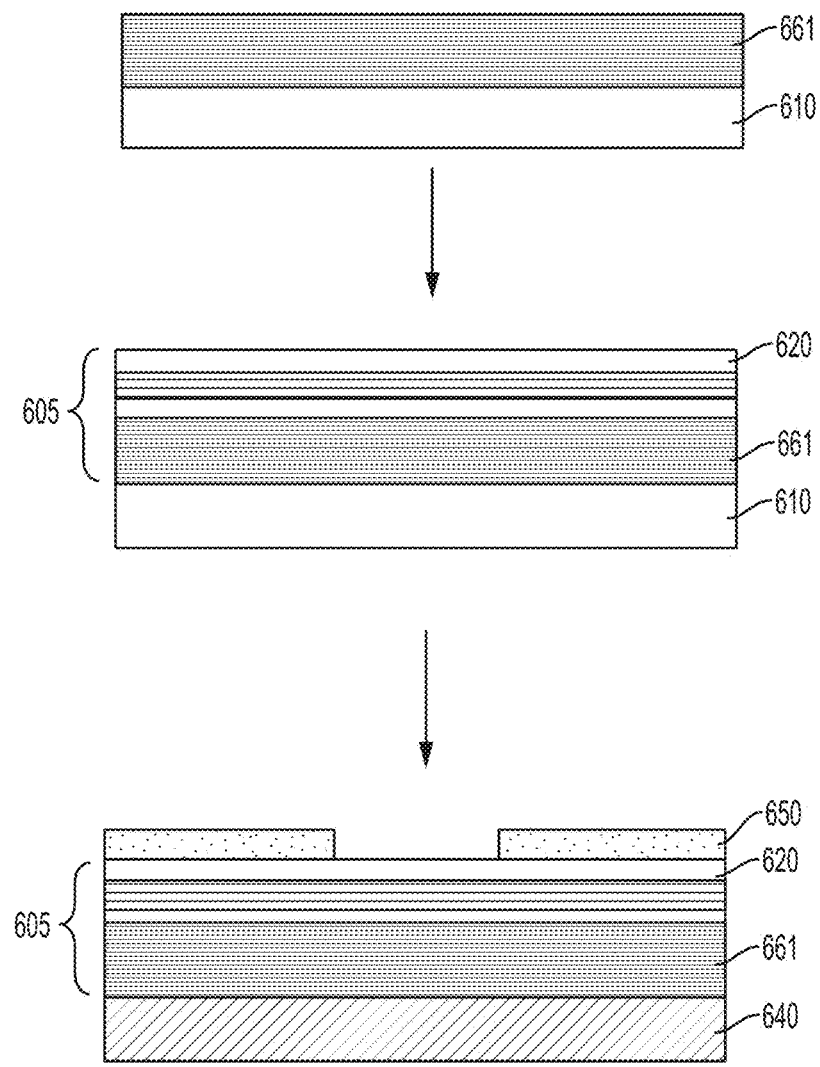
FIGS. 6, 7, and 8 show approaches for the formation of a laser device having a non-c-plane oriented active region in accordance with some embodiments.
Figure 7:
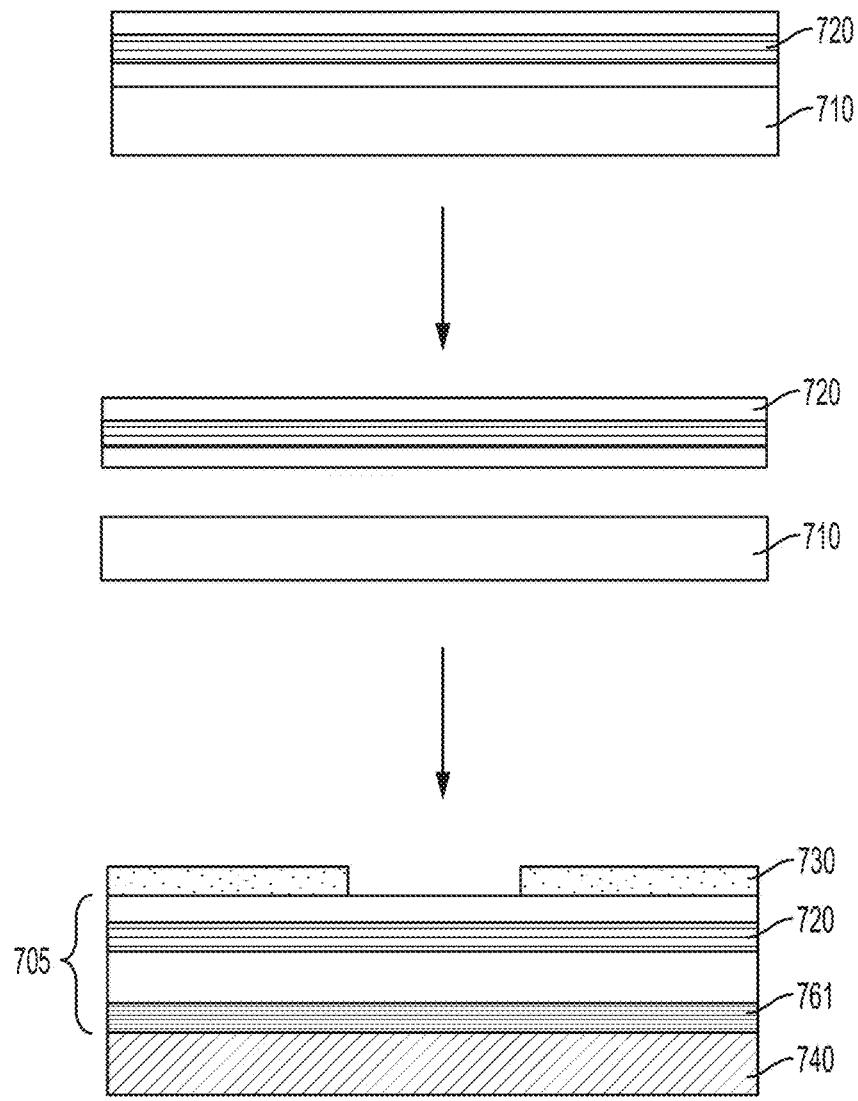

FIGS. 6 and 7 show approaches for the formation of a laser device having a non-c-plane oriented active region. In some embodiments, shown in the top cross sectional diagram of FIG. 6, reflector 661 is a distributed Bragg reflector (epi-DBR) that is epitaxially grown on the non-c-plane oriented substrate 610. The epi-DBR 661 comprises a series of alternating semiconductor layers disposed on the substrate 610 that take on the non-c-plane orientation of the substrate 610. For example, if non-c-plane oriented AlN is used as the substrate 610, then an epi-DBR may comprise alternating layers of non-c-plane oriented AlGaN and AlN grown on the non-c-plane oriented AlN substrate 610. Using an epi-DBR helps to promote heat dissipation from the active region because the semiconductor layers of the epi-DBR can provide some heat sinking. A non-c-plane oriented heterostructure 620, including the active region is epitaxially grown on the non-c-plane oriented epi-DBR 661.

As shown in the middle cross sectional diagram of FIG. 6, after the non-c-plane oriented epi-DBR 661+ heterostructure subassembly 605 is formed, the substrate 610 may optionally be fully or partially removed, for example, using a laser liftoff process (LLO), mechanical polishing and/or dry/wet chemical etching. In some configurations, a thin remnant of the substrate may remain after the removal.

As shown in the bottom cross sectional diagram of FIG. 6, in some configurations the DBR+heterostructure subassembly 605 can be bonded epi-DBR side down to a heat sink 640 to enhance heat dissipation from the active region. The heat sink 640 may comprise a metal, metal-alloy or other materials having sufficient thermal conductivity, e.g., diamond, copper, copper-tungsten, aluminum, AlSiC, and/or other materials or material composites. One or more contacts 650 for discharging electrons from the active region can be deposited over the heterostructure 620.

Another approach for the formation of a laser structure, shown in FIG. 7, involves the use of a first DBR 761 comprising a dielectric layers which are deposited on the backside of a non-c-plane oriented epitaxially grown heterostructure 720. For example, the dielectric DBR 761 may comprise pairs of $SiO_2/Al_2O_3$, $SiO_2/Y_2O_3$ or $SiO_2/HfO_2$. Dielectric materials used to form a dielectric DBR can have higher refractive index contrast than semiconductor materials. Thus, for the same reflectivity, a dielectric DBR can have fewer layer pairs when compared to the number of semiconductor layer pairs of an epitaxially grown DBR. However, dielectric materials have lower thermal conductivity which may be a factor for devices that need heat dissipation from the active region.

As shown in the cross sectional diagram at the top of FIG. 7, a non-c-plane oriented heterostructure 720 comprising a non-c-plane oriented active region configured to emit UV radiation is epitaxially grown on substrate 710. The substrate 710 is fully or partially removed from the heterostructure 720 as shown in the middle cross sectional diagram of FIG. 7. After removal of the substrate, a dielectric DBR 761 is deposited on one surface of the heterostructure 720, e.g. the backside surface which is the surface of initial epitaxial growth of the heterostructure 720. If a remnant of the substrate remains, the dielectric DBR 761 is deposited on the substrate remnant.

One or more contacts 750 are disposed on the heterostructure surface opposite the dielectric DBR as shown in the bottom cross sectional diagram of FIG. 7. In the implementation shown in FIG. 7, the DBR+heterostructure subassembly 705 can be arranged DBR side down on a heat sink 740 that provides dissipation of heat generated in the active region.

Returning now to FIG. 5, according to some embodiments, one or more of the first and second reflectors 561, 562 may be external reflectors. A gap separates an external reflector from the heterostructure 520 and/or other layers disposed on the heterostructure 520. An external reflector may include an epitaxial DBR and/or a dielectric DBR as discussed above. In some embodiments, the second DBR may comprise an epi-DBR or dielectric DBR disposed on the heterostructure as illustrated by FIG. 7.

Figure 8:
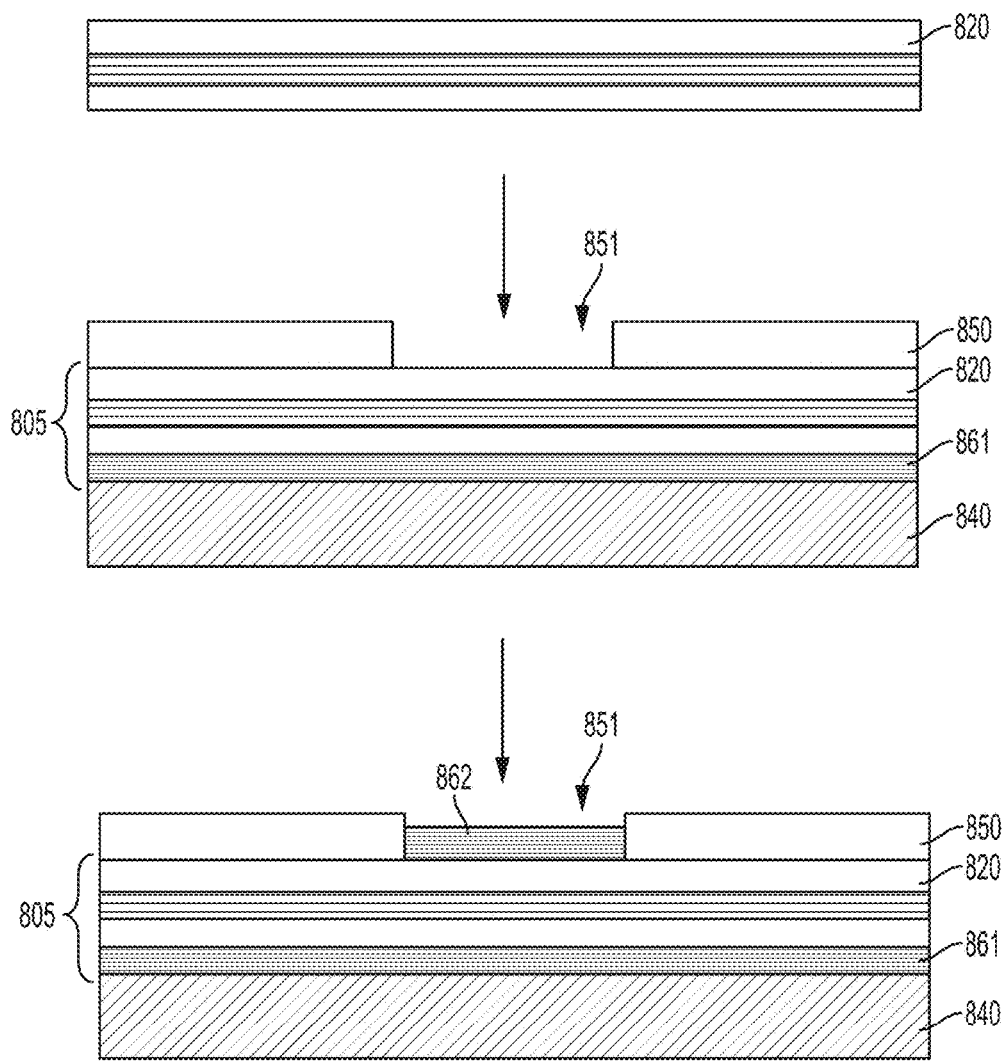

The cross sectional diagram at the top of FIG. 8 shows a non-c-plane oriented heterostructure 820 comprising a UV emitting active region. The non-c-plane oriented heterostructure has been epitaxially grown on a non-c-plane oriented substrate which is subsequently completely removed or thinned to a remnant and is not shown in FIG. 8. After removal of the substrate, a dielectric DBR 861 is deposited on one surface of the heterostructure 820, e.g. the backside surface which is the surface of initial epitaxial growth of the heterostructure 820. If a remnant of the substrate remains, the dielectric DBR 861 is deposited on the substrate remnant. Alternatively, a non-c-plane oriented epi-DBR may be grown on the substrate prior to growth of the non-c-plane oriented heterostructure 820.

One or more contacts 850 are disposed on the heterostructure surface opposite the DBR 861 as shown in the bottom cross sectional diagram of FIG. 8. In the implementation shown in FIG. 8, the DBR+heterostructure subassembly 805 can be arranged DBR side down on a heat sink 840 to provide for dissipation of heat generated in the active region.

A second DBR 862, e.g., an epi-DBR or dielectric DBR, may be epitaxially grown or deposited such that the second DBR 862 is disposed within the aperture 851 of the patterned contact 850.

In some embodiments, a UV emitting device may be an edge emitting laser device having a non-c-plane oriented active region. The edge emitting laser device may be configured for generation of UV stimulated emission. In some embodiments the edge emitting devices are grown on a substrate, e.g., AlN having a non-polar orientation along the $(1\bar{1}00)$ or $(-1\text{-}100)$ plane, referred to as the m-plane. In some embodiments the surface of the substrate may be oriented along the non-polar $(\bar{1}\bar{1}20)$ or $(-1\text{-}120)$ plane, referred to as the a-plane. The surface of the substrate may be oriented along a semi-polar plane such as $(11\bar{2}2)$ or $(11\text{-}22)$, $(20\bar{2}1)$ or $(20\text{-}21)$, and $(20\bar{2}\bar{1})$ or $(20\text{-}2\text{-}1)$ in some embodiments. Other common semi-polar crystal planes that could be used in embodiments disclosed herein include (10-11), (10-1-1), (11-2-2), (10-13), (10-1-3), (30-31), and (30-3-1), and others. The layers above the substrate, including the cladding and active layers, take on the semi-polar or non-polar orientation of the substrate.

Figure 9:
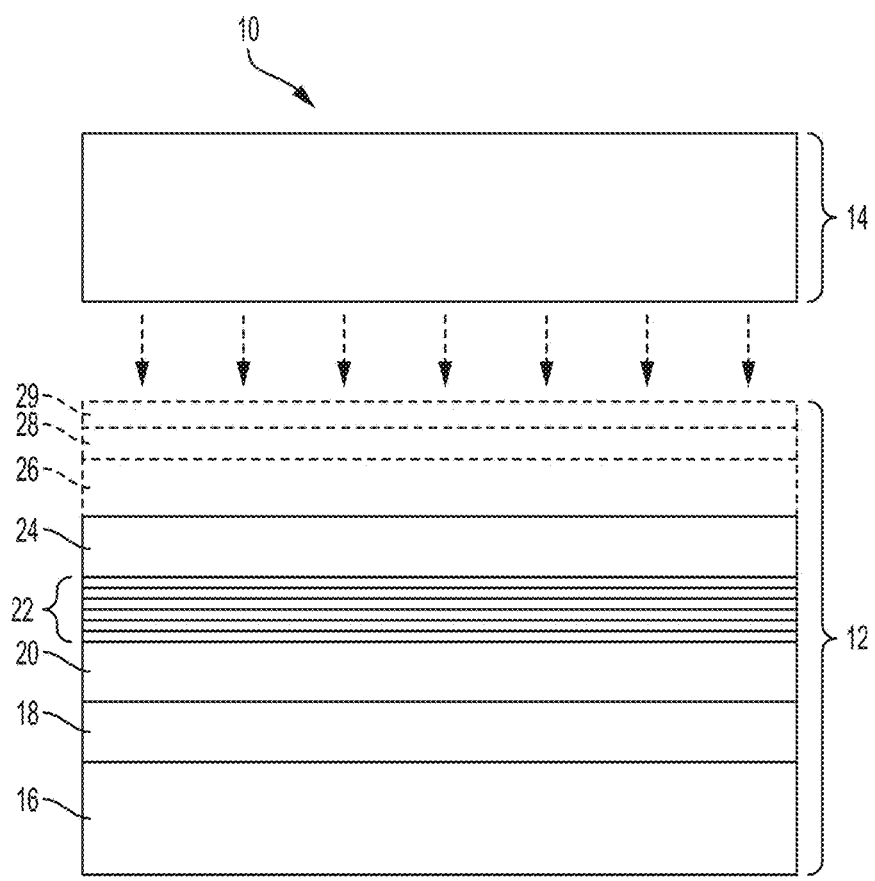
FIG. 9 is a side-view of a semiconductor laser structure according to one embodiment of the present disclosure.

FIG. 9 shows a cross sectional diagram of a UV edge emitting laser 10 in accordance with some embodiments. Device 10 comprises a semiconductor laser structure 12 and electron-beam pump source 14 according to one embodiment of the present disclosure. Semiconductor laser 12 comprises a non-polar or semi polar substrate 16. In some embodiments, the substrate 16 may comprise bulk AlN. Above substrate 16 is formed a lower cladding layer 18 of $Al_xGa_{1-x-y}In_yN$ where x is between 0.6 and 1 and y is between 0 and 0.03, for example n-$Al_{0.74}Ga_{0.26}N$.

A lower waveguide 20 may be formed over lower cladding layer 18 of $Al_zGa_{1-z-y}In_yN$ where z is between 0.5 and 1 and y is between 0 and 0.03, and z<x. For example, lower waveguide 20 may comprise n-$Al_{0.7}Ga_{0.3}N$ (e.g., 40 nm thick).

An active layer 22, such as a multiple quantum well heterostructure (MQW) or double heterostructure (DH) region may be formed over lower waveguide 20. Active layer 22, in the case of a MQW, may comprise pairs of $Al_xGa_{1-x}N/AlyGa_{1-y}N$ of varying thickness (e.g., 5 layer pairs of $Al_{0.57}Ga_{0.43}N/Al_{0.62}Ga_{0.38}N$, 5.4 nm and 9.6 nm, respectively). In general, active layer 22 may comprise at least one layer of $Al_uGa_{1-u-v}In_vN$ where v is between 0 and 0.03, and 0.4<u<z. In the case of a MQW, in general the barrier may be $Al_sGa_{1-s-t}In_tN$, where 0.4<u<Z and s>u+0.04, and t is between 0 and 0.03. In such a case, the quantum well thickness may be between 1 and 6 nm and the barrier thickness may be between 3 and 20 nm.

An upper waveguide 24 may be formed over active layer 22, comprising, for example, n-doped AlGaN (such as 40 nm of n-$Al_{0.7}Ga_{0.3}N$), undoped AlN, and so on.

Optionally, upper cladding layer 26 may be formed over upper waveguide 24. (Optional layers, elements, and features for various embodiments may be indicated with dashed outlines.) When fabricated without an upper cladding layer, upper waveguide 24 is formed to be relatively thick, on the order of about 200 nm for example. When fabricated with upper cladding layer 26, layer 26 may comprise n-doped AlGaN (such as having at least 70% Al, for example n-$Al_{0.78}Ga_{0.22}N$, 220 nm thick). In some embodiments, such as at very high Al concentration, the upper cladding layer 26 may be undoped. In some embodiments, at least one of the lower cladding layer, lower waveguide layer, light emitting layer, upper waveguide layer, or upper cladding layer is doped n-type.

Optionally, in certain embodiments, at least one of the lower cladding layer, lower waveguide layer, light emitting layer, upper waveguide layer, and upper cladding layer is a short-period superlattice. In addition, in certain embodiments, at least one of the lower cladding layer, lower waveguide layer, upper waveguide layer, or upper cladding layer may be a monotonically-varying alloy-compositional gradient, with the lower band gap composition of the graded layer nearest the light emitting layer.

Also optionally, a contact layer 28 may be provided over upper cladding layer 26. Contact layer 28 may comprise n-GaN as one example. A suitable ohmic metal layer 29 may be formed over contact layer 28 (such as 30 nm of Ti) to permit conduction of charge from the laser device, discussed further below.

It will be appreciated that at relatively high thicknesses of active layer 22, active layer 22 may itself provide a wave guiding function, obviating the need for a separate lower waveguide 20 and/or upper waveguide 24, and otherwise providing a light guiding layer. Thus, in certain embodiments lower and upper waveguides form a light guiding structure within which a light emitting layer is disposed. In other embodiments, the thickness and other characteristics of the light emitting layer provide light guiding at upper and lower margins, thereby also forming a light guiding structure within which a light emitting layer is disposed.

Electron-beam pump source 14 is disposed to be over, and in some embodiments, spaced apart from a top surface of semiconductor laser 12. Electron beam ("e-beam") pump source 14 is connected to a driving voltage such that it produces a line-pattern (e.g., 12 μm×500 μm) electron beam in a direction toward and into the top surface of semiconductor laser 12.

Figure 10:
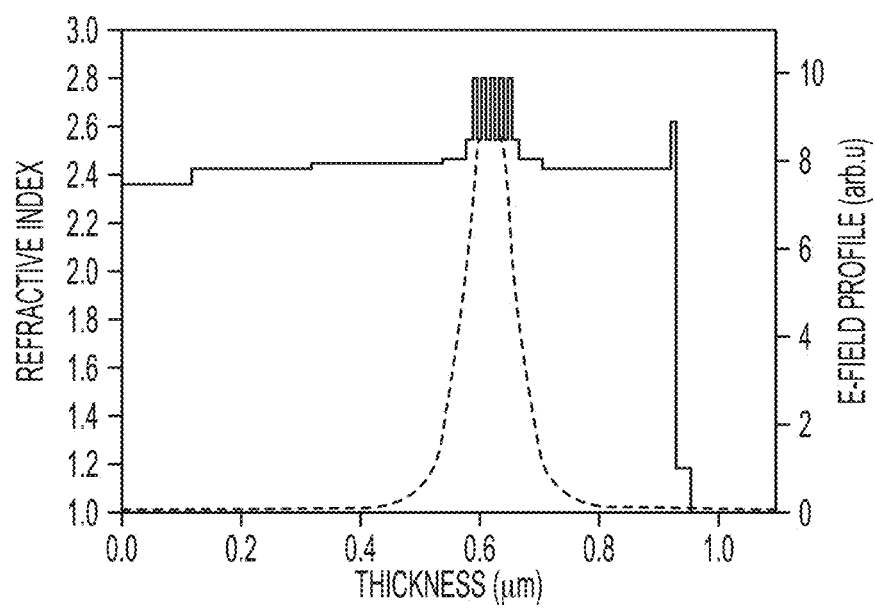
FIG. 10 is a plot of refractive index and field profile versus thickness for a sample device according to an embodiment of the present disclosure.

The structure described above has been built and modeled. Emission wavelengths for such a structure may be obtained, depending upon materials and compositions, for example in the range of 200 nm to 365 nm. FIG. 10 is an illustration of the modeling of the structure for a target emission wavelength at λ=265 nm. For the model, the structure includes a 220 nm thick n-$Al_{0.78}Ga_{0.22}N$ top cladding layer, a 5 nm thick n-GaN contact layer, and a 30 nm thick Ti metal top contact/discharge layer. As can be seen from FIG. 9, the refractive index for the various layers is shown, as is the optical mode (i.e., e-field of the lasing mode) profile. In the ideal case, the carrier generation peaks at the center of the MQW, in order to most efficiently generate photons therein. The model of FIG. 10 predicts a comparatively high Γ, on the order of 25%, and a comparatively low loss of less than 1 $cm^{-1}$.

Figure 11A:
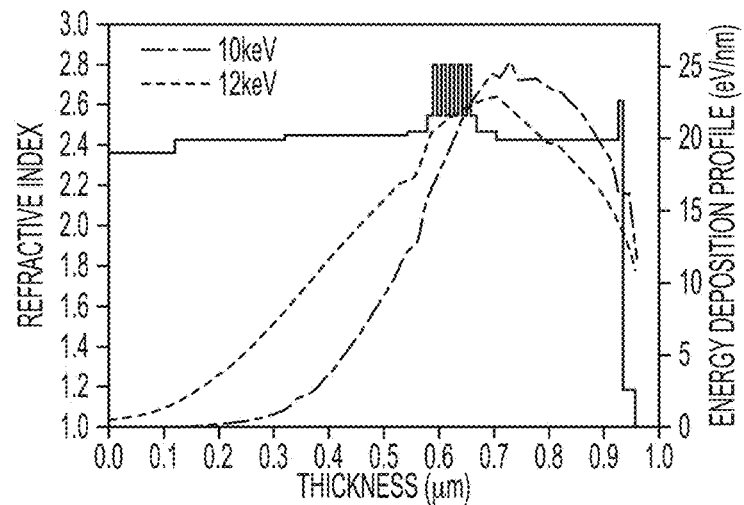
FIG. 11A is a plot of refractive index and energy deposition profile versus thickness for the sample device of FIG. 10.

FIG. 11A is a graph of the modeling of the structure of FIG. 9, showing calculated energy deposition profile versus depth into the semiconductor laser structure for two selected e-beam energies. As can be seen from FIG. 10A, for 10 keV and 12 keV, about 32 percent and 30 percent of the total energy, respectively, is deposited into the MOW region and waveguide layers (upper and lower). The rate of electron-hole generation at a given depth is proportional to the energy deposition at that depth. The more energy that is deposited into these regions, the higher the expected laser output power.

Figure 11B:
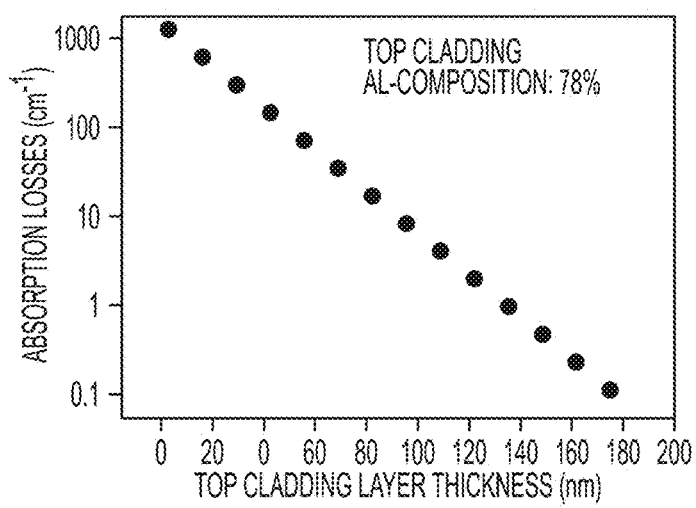
FIG. 11B is a plot of absorption loss against top cladding thickness for the sample device of FIG. 10.

The effect of cladding layer thickness on absorption losses for this structure is illustrated in FIG. 11B. It can be seen from FIGS. 11A and 11B that a thicker cladding layer limits the depth of the peak of the energy deposition profile yet provides lower absorption loss, and conversely a thinner cladding layer permits a deeper peak of the energy deposition profile (e.g., closer to the active region) yet results in higher absorption loss. From data such as provided in FIGS. 11A, 11B, design parameters may be chosen as a function of the specific application of the teachings of the present disclosure to permit balancing and ultimately optimizing both the energy deposition profile of the electron beam and the absorption losses induced mainly by the top surface layers (contact layer, top metallization).

The results shown in FIGS. 10 and 11A, 11B support the operability and advantages of a laser structure, such as that described above, that operates without an upper p-doped layer. Again, one significant advantage provided thereby is elimination of a p-doped layer with high electrical conductivity and low absorption losses that is very challenging to fabricate for high band gap materials.

Using an electron beam as an excitation source takes advantage of the fact that generation of carriers by electron beam means that carrier generation and injection does not rely on a p-/n-junction. This obviates the challenge of forming a highly conductive (p-type) material in high band gap semiconductors that is able to carry the current densities necessary for laser emission. Thus, no p-type doping of an upper cladding layer is required. In addition, carrier injection by e-beam is comparatively deep, extending beyond the top most MQW layers. This homogeneous carrier injection supports an increased number of quantum wells in the MQW layer than typically is achieved in a laser diode. Higher gain and improved device performance are thereby provided.

E-beam pumping produces a net charge within the laser structure. Thus, the laser heterostructures and the device architectures disclosed herein include features to allow effective discharge of the device, e.g., it includes conductive layers that are n-doped (and may include p-doped layers), metal films and/or contacts and connections to ground or the anode of the e-beam source. In the example above, an n-type upper cladding and metal ohmic contact are provided over the MQW, solely for this discharge function. However, it will be understood that this is simply one example of a family of structural configurations in which an upper p-type cladding is obviated bye-beam pumping. Many variations are contemplated herein.

Figure 12:
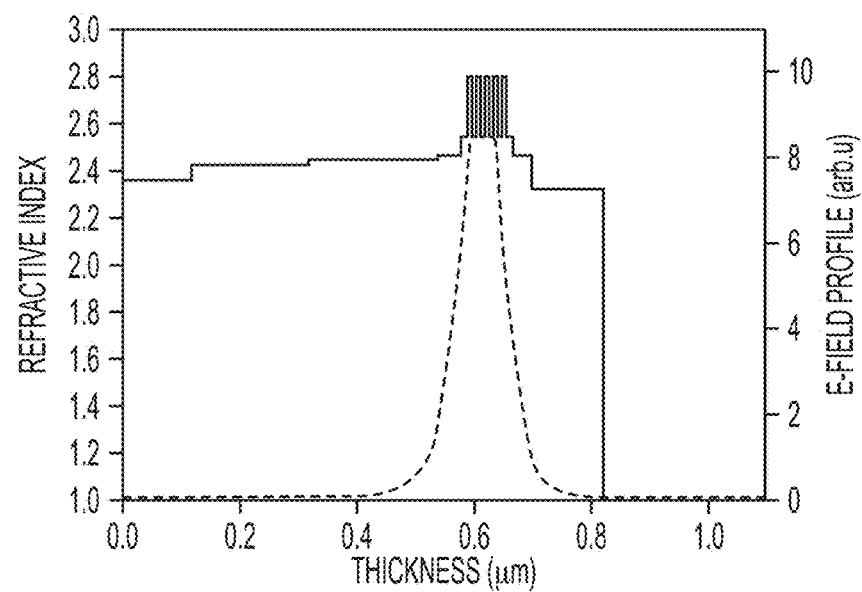
FIG. 12 is a plot of refractive index and field profile versus thickness for a sample device according to another embodiment of the present disclosure.
Figure 13A:
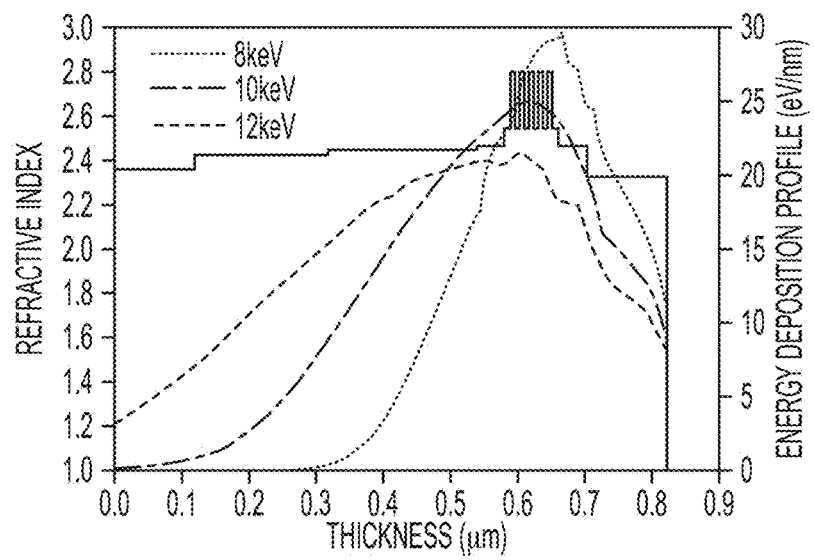
FIG. 13A is a plot of refractive index and energy deposition profile versus thickness for the sample device of FIG. 12.
Figure 13B:
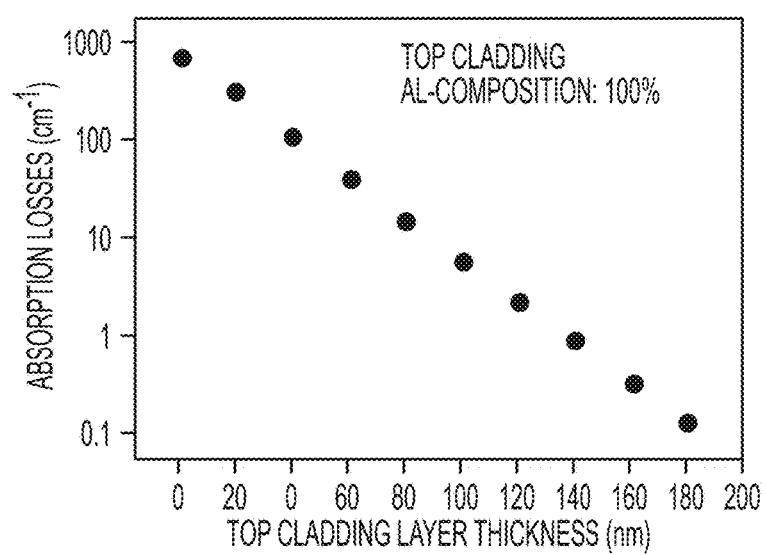
FIG. 13B is a plot of absorption loss against top cladding thickness for the sample device of FIG. 12.

For example, FIG. 12 shows an alternative semiconductor laser design for electron beam pumped operation at a target emission wavelength of Λ=265 nm, and FIG. 13A shows calculated e-beam energy deposition profile for that design. FIG. 13B illustrates the effect of cladding layer thickness on absorption losses for this structure. The structure modeling in FIGS. 12 and 13A, 13B is similar to that of FIGS. 10 and 11A, 11B, with the exception that the structure of FIGS. 12 and 13A, 13B has an undoped 120 nm thick AlN top cladding layer and a lack of any contact layer and upper ohmic metal layer. Noteworthy is the result that lower absorption losses may be obtained for a thinner top cladding layer as compared to the structure of FIGS. 10 and 11A, 11B. The energy profile peak may therefor occur closer to the active region. The lack of upper contact layers means that discharge of the device is provided not via the top surface, but instead through the n-AlGaN lower cladding layer and/or laterally via mesa side contacts, as an option.

The laser heterostructure in the prior example was designed to allow discharge via its top surface. Therefore the AlGaN composition of the cladding layer was limited to provide sufficiently high conductivity (e.g., the Al-composition is 78%). To avoid high absorption losses through the GaN cap layer and/or metal contact, the cladding layer in that example was chosen to be relatively thick, on the order of 220 nm. In the present example, however, there is no concern with regard to conductivity of the upper cladding layer, so it may be entirely non-conductive AlN. Furthermore, by reducing the thickness of the AlN upper cladding later, carrier generation and confinement within the MQW active region is improved. Thus, the upper cladding layer was selected, as an example here, to be on the order to 120 nm thick.

In order to provide a discharge path for the device illustrated in FIG. 12, etching is performed to form a mesa structure, with the lower cladding layer exposed for electrical contact. Metal may be deposited on selected portions of the exposed surfaces, either at the bottom of the etched region adjacent the device or the sidewall of the device, or both, for the requisite conduction path. Again, no GaN contact layer or top metal is needed. The waveguide simulations produce a comparatively high Γ, on the order of 25%, and a comparatively low loss of less than 1 $cm^{-1}$.

The energy deposition profiles of the excitation source are shown in FIG. 13A for excitation energies of 8, 10, and 12 keV. This produced 52, 41, and 28% of the total energy is deposited into the active zone and waveguide layers for 8, 10, and 12 keV, respectively. The absolute deposited energy in the active zone and waveguide layers, with the same current for the different excitation energies, is very similar for 8 and 10 keV and about 20% less for 12 keV.

Figure 14:
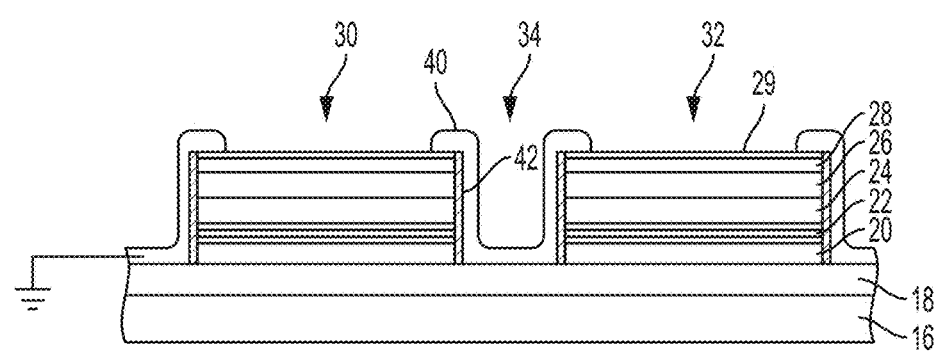
FIG. 14 is a side-view of two semiconductor laser structures, including conduction path metallization, according to an embodiment of the present disclosure.

An individual device or array of devices may be formed on a substrate having a non-polar or semi-polar orientation and having the layer composition illustrated in FIG. 14. A structure may be formed with such a layer composition, and then etched to form individual devices. Two such devices 30, 32 are shown in FIG. 14, separated by an etched region 34. A dry etch, for example using chemically assisted ion beam etching (CAIBE) or inductively-coupled plasma reactive ion etching (ICP-RIE), facet cleaving, or other processes known in the art may be used to form both the etched region 34 as well as the laser facets. Etching may proceed into the lower cladding layer 18, exposing that layer. A contact metal 40 (for example, a layered structure of Ti(20 nm)/Al(100 nm)/Ni(45 nm)/Au(60 nm) annealed at about 900° C. for roughly one minute, which forms a functional ohmic contact to the n-type AlGaN) may then be formed over portions of devices 30, 32, and within etched region 34 to form a conduction path for discharging the devices (e.g., tied to ground). Optionally, sidewall passivation 42 may be formed on the sidewalls of devices 30, 32 prior to forming contact metal 40.

Figure 15:
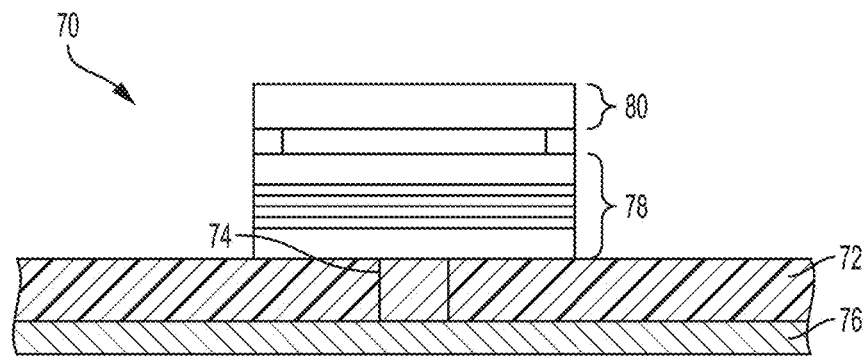
FIG. 15 is a cut-away side view of a light emitting device having a substrate and via connection to a discharge structure, according to an embodiment of the present disclosure.

While the previous embodiment forms a discharge path using a deposited metal in etched regions between devices, in other embodiments, direct contact to the ohmic metal layer 29 may be made to each device, or groups of devices, for discharging. As mentioned, contact layer 29 is relatively thin, on the order of 30 nm for a material such as Ti, such that the electron beam may easily penetrate into the active region of the device. Similarly, a backside metal layer may be provided for electrical and thermal discharge. One such device 70 is illustrated in FIG. 15. Device 70 comprises a substrate 72 having a via 74 formed therein, and a conductive discharge structure 76 disposed on a first surface. A light emitting device 78 is disposed on a second surface of substrate 72 opposite the surface on which the light emitting device 78 is disposed. Via 74, or more precisely, conductive material disposed in via 74, electrically interconnects conductive discharge structure 76 and device 78 such that charge that may accumulate in device 78 due to electron beam pumping from electron beam pump 80 may be discharged through structure 76, such as to ground potential. Many other discharge structures are contemplated hereby, including one or more conductive intermediate layers, sidewalls, and so on.

Figure 16:
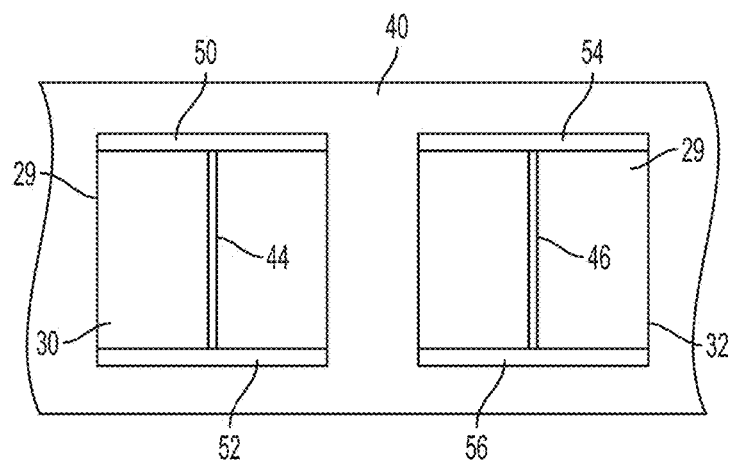
FIG. 16 is a top-view of the two semiconductor laser structures, including conduction path metallization, according to the embodiment of FIG. 14.

Following the formation of devices 30, 32, individual electron beam sources may be formed or disposed over each device. According to one embodiment, prefabricated electron beam sources are selected to have a beam length comparable to the length of the resonance cavity (between facets 50, 52 of device 30 and facets 54, 56 of device 32), for example on the order of 300-500 μm. Indeed, the length of the resonator is primarily limited by the output format of the electron beam source. FIG. 16 illustrates a top-view of devices 30, 32, with the position of an electron beam on each device indicated by lines 44, 46, respectively.

The resulting device may be operated in vacuum. According to certain embodiments, the output power density may be in the range of 50 kW/cm$^2$ to about 1 to 2 MW/cm$^2$. The acceleration voltage may be on the order of 10 kV. The spot size may be on the order of 12×500 microns. That is, current is on the order of 0.6 mA to 6-12 mA, with a higher current producing a higher the output power. Again, these ranges are merely one set of examples, and other ranges are also contemplated by the present disclosure. Additional information regarding e-beam pumped edge-emitting devices is described in U.S. Pat. No. 8,964,796 which is incorporated herein by reference.

EXAMPLE

AlGaN multiple quantum wells (MQWs) were grown on semipolar (20-21) AN to mitigate the issues related to the polarization switching for short-wavelength deep-UV optical emitters. Structural properties were accessed by x-ray diffraction and atomic force microscopy (AFM) while the emission behavior was monitored by photoluminescence (PL) studies.

The single crystal AlN substrates used in these studies were fabricated from AlN boules grown by physical vapor transport and were nominally (20-21) oriented with less than 1° in miscut. After slicing, the substrates were chemomechanically planarized (CMP) and have a typical root mean square (rms) surface roughness of about 0.1 nm as measured by AFM. The structural quality of the substrates were confirmed by x-ray rocking curve measurements which reveal full width at half maximum (FWHM) values as low as 37 arc sec for both the (002) and (102) reflections. The dislocation density was less than $10^5$ cm$^{-2}$.

Figure 17:
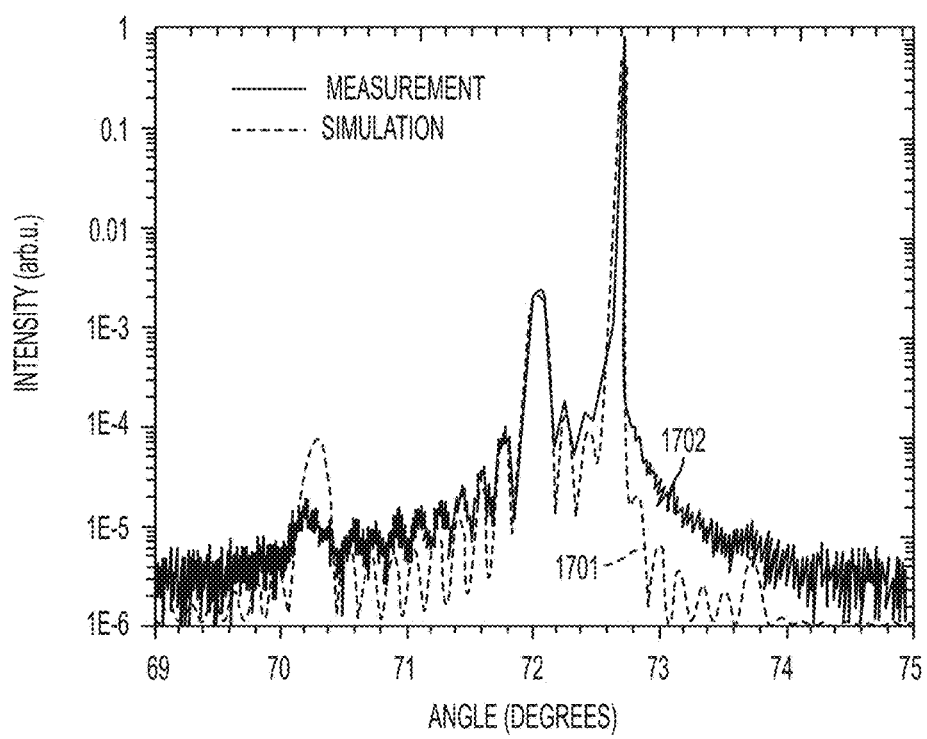
FIG. 17 is a high-resolution ω-2Θ x-ray scan of 10× AlGaN multiple quantum well heterostructure on semipolar (20-21) bulk AlN substrate in accordance with some embodiments.

The AlGaN heterostructures were grown by metal-organic vapor phase epitaxy (MOVPE) with conventional pre-cursor sources. The multiple quantum wells (MQWs) active zone consisted of 10 pairs of Al$_x$Ga$_{1-x}$N/Al$_y$Ga$_{1-y}$N QWs with a thickness of about 3 and 10 nm, and x=0.69, y=0.90, respectively. FIG. 17 compares simulated 1701 and measured 1702 plots of ω-2Θ x-ray diffraction scan of the (20-21) semipolar AlGaN MQW stack. As can be seen, higher-order Pendelloesung fringes can be resolved, which imply sharp and abrupt interfaces between the individual layers of the heterostructure. Good agreement between measurement and simulation is also evident.

Figure 18:
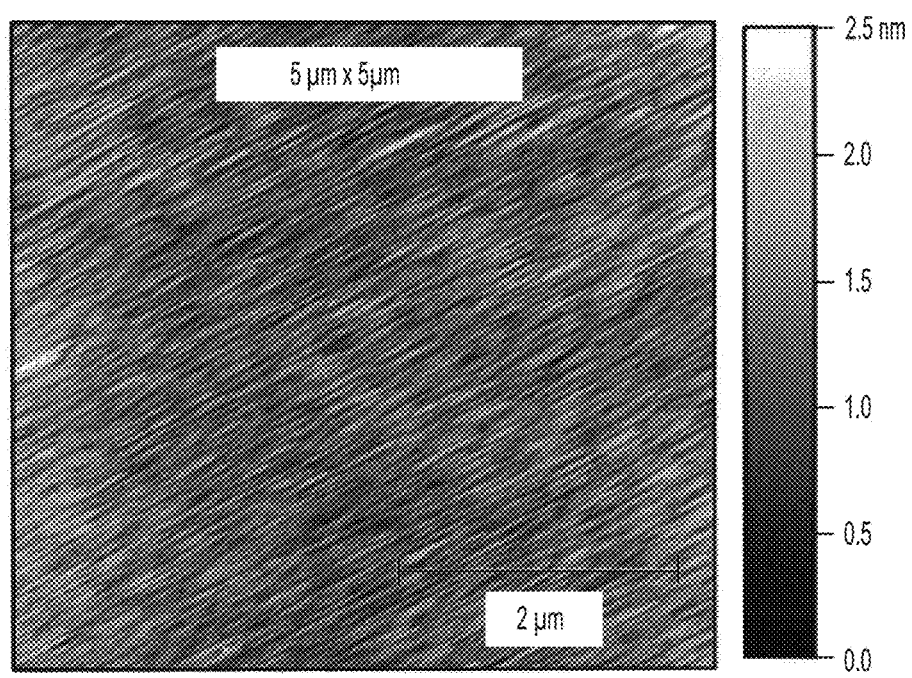
FIG. 18 is an atomic force microscopy image of a 10× AlGaN multiple quantum well heterostructure grown on (20-21) bulk AlN substrate in accordance with some embodiments.

To further assess the structural properties atomic force microscopy (AFM) images were taken from the sample surface. FIG. 18 is an AFM image of the sample surface. As shown in FIG. 18 relatively smooth layers could be realized with an rms surface roughness of less than 1 nm or even less than 0.35 nm for a 5 μm×5 μm scan.

Figure 19:
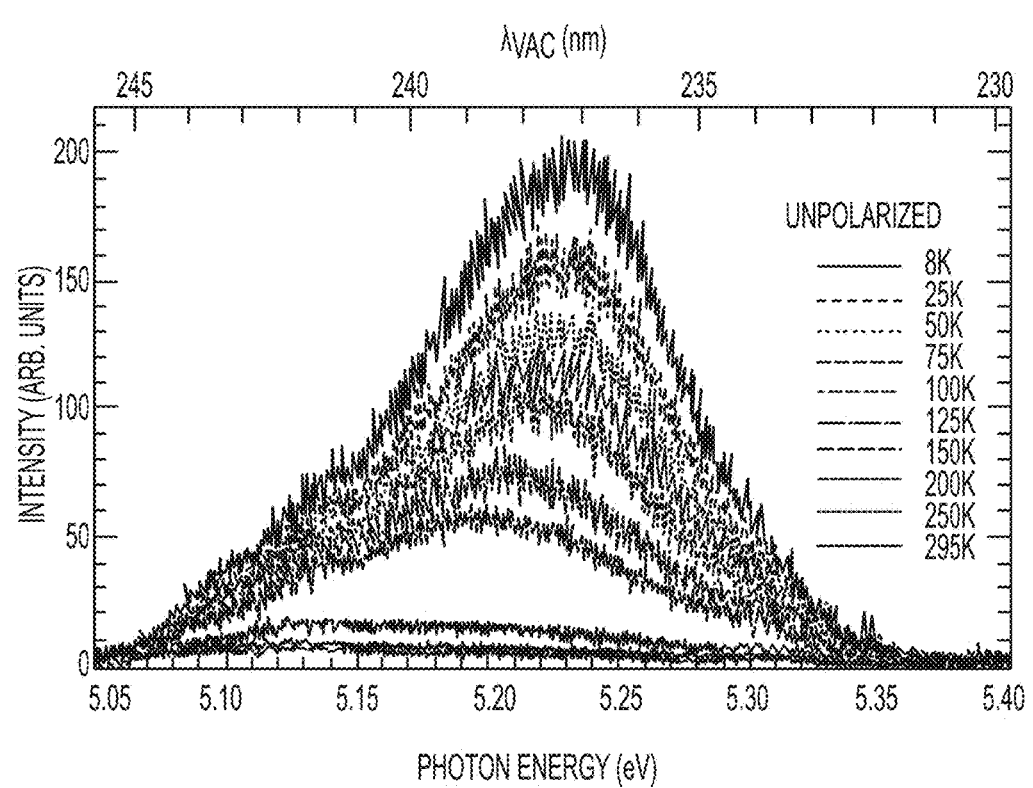
FIG. 19 shows the temperature-dependent photoluminescence spectra recorded from a semipolar (20-21) AlGaN multiple quantum well heterostructure in accordance with some embodiments.
Figure 20:
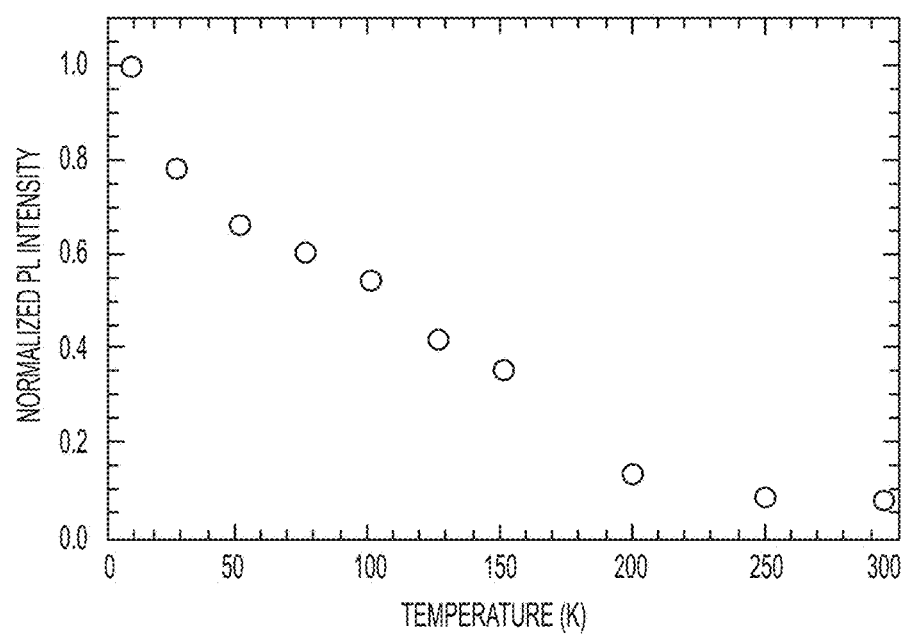
FIG. 20 shows a graph of the normalized temperature-dependent photoluminescence intensity where values for the intensities are gained from integrating the spectra of FIG. 10.

The optical properties were assessed by temperature- and polarization-dependent photoluminescence measurements by using a pulsed 193 nm ArF excimer laser as excitation source. The emission was recorded perpendicular to the sample surface without a polarizer in the optical path for the temperature-dependent measurements. FIG. 19 shows a series of photoluminescence (PL) spectra recorded between 8K and room temperature 295K. A clear QW emission was observed at about 237 nm at low temperature which shifts to longer wavelength with increasing temperature. The rather pronounced decrease in emission intensity with increasing temperature can be ascribed to the presence of non-radiative recombination channels that dominate the recombination process at elevated temperatures. An upper value for the internal quantum efficiency (IQE) of about 7.5% at room temperature is estimated taking into consideration the ratio of the PL intensity at room temperature and low temperature as indicated in FIG. 20.

Figure 21:
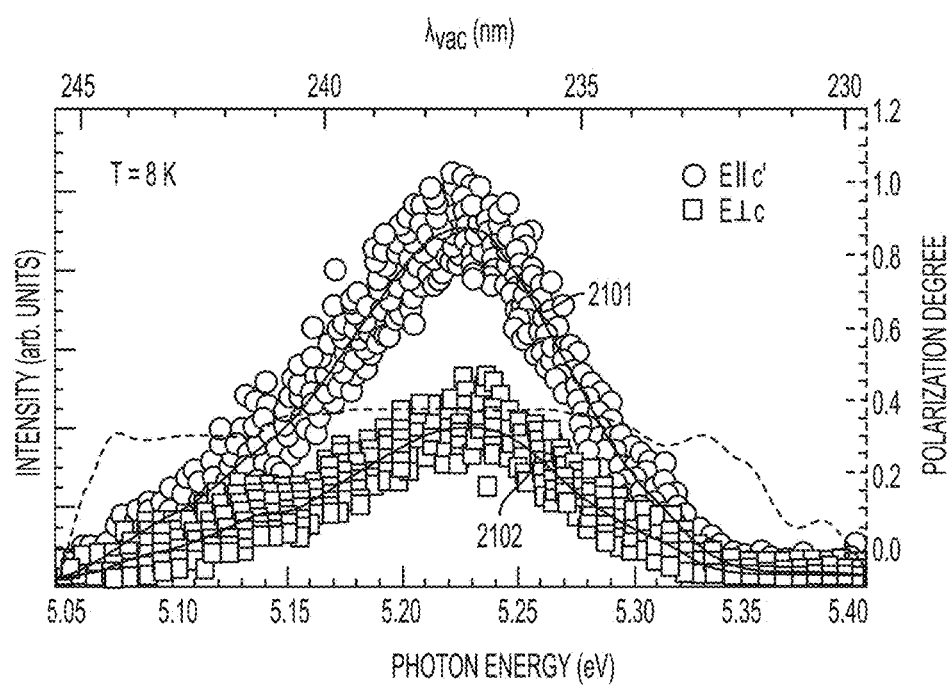
FIG. 21 shows polarization-resolved photoluminescence spectra from semipolar AlGaN multiple quantum wells grown on (20-21) bulk AlN substrate in accordance with some embodiments.

The polarization characteristics of the semipolar QWs emission were assessed by inserting a polarizer into the optical detection path of the PL setup. In contrast to the case for conventional c-plane material, polarized light emission is expected for group III-Nitrides grown on non- and semipolar crystal orientations. As can be seen in FIG. 12 strong light polarization was determined for the measured MQW sample emitting at λ=237 nm. The integrated polarization is at least 35%, with the spectral dependence shown in FIG. 21. As theoretically predicted the stronger emission was recorded for light that is linearly polarized parallel to the c'-axis of the wurtzite crystal as shown in plot 2101, whereas the weaker emission originates from polarized light perpendicular to the c-axis as shown in plot 2102.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in radiation of the above teaching.

The invention claimed is:

1. A method, comprising:
slicing a bulk AlN boule to provide a substrate having a growth surface having a non c-plane crystallographic orientation;
epitaxially growing an epitaxial AlN layer having the non-c-plane crystallographic orientation on the growth surface; and
epitaxially growing a III-N heterostructure comprising an UV emitting active region, the heterostructure having the non-c-plane crystallographic orientation on the epitaxial AlN layer, the UV emitting active region configured to emit UV radiation in response to electron beam pumping of the active region.

2. The method of claim 1, wherein epitaxially growing the heterostructure comprising the UV emitting active region comprises epitaxially growing multiple AlGaInN quantum wells having Al content greater than about 50%.

3. The method of claim 1, wherein the non-c-plane crystallographic orientation is a (20-21) crystallographic orientation.

4. The method of claim 1, wherein epitaxially growing the heterostructure comprises growing a heterostructure having a surface roughness less than about 1 nm for a 5 μm×5 μm scan as measured by atomic force microscopy.

5. The method of claim 1, wherein epitaxially growing the III-N heterostructure comprising the UV emitting active region comprises epitaxially growing an AlGaInN active region including one or more quantum well structures with Al content greater than about 50% having a non-c-plane crystallographic growth orientation.

6. The method of claim 5, wherein the quantum well structures have a semi-polar crystallographic growth orientation.

7. The method of claim 6, wherein the semi-polar crystallographic growth orientation is a (20-21) or (20-2-1) orientation.

8. The method of claim 1, wherein the active region is configured to provide spontaneous or stimulated emission at wavelengths less than 250 nm.

9. The method of claim 1, wherein the active region includes about 1 to about 50 quantum wells having Al composition of about 70%.

10. The method of claim 9, wherein the quantum wells of the active region are separated by barrier layers having Al composition between about 80% to about 99%.

11. The method of claim 9, wherein a thickness of each quantum well is in a range of about 0.5 nm to about 5 nm.

12. The method of claim 1, wherein a thickness of the active region is in a range of about 200 nm to 1000 nm.

13. The method of claim 1, wherein at least a portion of the heterostructure is n-doped.

14. The method of claim 1, wherein a degree of polarization of UV radiation emitted by the active region is at least about 35%.

15. The method of claim 1, further comprising thinning the sliced bulk AlN substrate.

16. A method, comprising:
slicing a bulk AlN boule to provide a substrate having a growth surface having a non c-plane crystallographic orientation;
epitaxially growing an epitaxial AlN layer having the non-c-plane crystallographic orientation on the growth surface; and
epitaxially growing a III-N heterostructure comprising an UV emitting active region, the heterostructure having the non-c-plane crystallographic orientation on the epitaxial AlN layer, the UV emitting active region configured to emit UV radiation in response to electron beam pumping of the active region; and
forming a first reflector and a second reflector, the active region disposed between the first reflector and the second reflector.

17. The method of claim 16, wherein:
the first reflector comprises an epitaxial distributed Bragg reflector (DBR) having a non-c-plane orientation; and
the epitaxial heterostructure is disposed on the first reflector.

18. The method of claim 16, further comprising forming at least one contact electrically coupled to the heterostructure that provides a current path for discharging electrons arising from electron beam pumping of the heterostructure.

19. The method of claim 18, wherein forming the contact includes forming the contact having an aperture and wherein the second reflector is disposed within the aperture.

20. The method of claim 18, wherein forming the second reflector comprises forming an epitaxial DBR disposed on the heterostructure.

* * * * *